(12) United States Patent
Hartner et al.

(10) Patent No.: US 11,791,529 B2
(45) Date of Patent: Oct. 17, 2023

(54) RADIO-FREQUENCY DEVICES AND ASSOCIATED PRODUCTION METHODS

(71) Applicant: Infineon Technologies AG, Neubiberg (DE)

(72) Inventors: Walter Hartner, Bad Abbach-Peissing (DE); Bernhard Rieder, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 129 days.

(21) Appl. No.: 17/444,864

(22) Filed: Aug. 11, 2021

(65) Prior Publication Data
US 2022/0059918 A1 Feb. 24, 2022

(30) Foreign Application Priority Data
Aug. 20, 2020 (DE) .......................... 102020121855.9

(51) Int. Cl.
*H01P 3/12* (2006.01)
*H01Q 1/50* (2006.01)
*H05K 1/02* (2006.01)

(52) U.S. Cl.
CPC ............... *H01P 3/121* (2013.01); *H01Q 1/50* (2013.01); *H05K 1/028* (2013.01); *H05K 1/0243* (2013.01); *H05K 2201/10098* (2013.01)

(58) Field of Classification Search
CPC ........ H01P 3/121; H01Q 1/50; H05K 1/0243; H05K 1/028; H05K 2201/10098

USPC ......................................................... 343/905
See application file for complete search history.

(56) References Cited

U.S. PATENT DOCUMENTS

| 9,583,811 | B2 | 2/2017 | Seler et al. | |
|---|---|---|---|---|
| 10,685,924 | B2 * | 6/2020 | Lasiter | H01L 24/20 |
| 11,003,884 | B2 * | 5/2021 | Buchan | H10N 30/87 |
| 2014/0285389 | A1 * | 9/2014 | Fakharzadeh | H01Q 13/02 343/786 |
| 2014/0320231 | A1 | 10/2014 | Seler et al. | |

(Continued)

FOREIGN PATENT DOCUMENTS

| DE | 60024684 T2 | 6/2006 |
|---|---|---|
| DE | 102014118563 A1 | 6/2015 |
| DE | 102014105594 A1 | 10/2015 |

(Continued)

*Primary Examiner* — Binh B Tran
(74) *Attorney, Agent, or Firm* — Harrity & Harrity, LLP

(57) ABSTRACT

A radio-frequency device comprises a printed circuit board and a radio-frequency package, which is mounted on the printed circuit board at a first mounting point and has a radio-frequency chip and a radio-frequency radiation element, wherein the printed circuit board has a first elasticity at least in a first section comprising the first mounting point. The radio-frequency device further comprises a waveguide component, which is mounted on the printed circuit board at a second mounting point and has a waveguide, wherein the radio-frequency radiation element is configured to radiate signals into the waveguide and/or to receive signals by way of the waveguide. The printed circuit board has a second elasticity at least in a second section with an increased elasticity between the first mounting point and the second mounting point, wherein the second elasticity is higher than the first elasticity.

21 Claims, 3 Drawing Sheets

(56) References Cited

U.S. PATENT DOCUMENTS

2016/0247780 A1 8/2016 Seler et al.
2020/0400815 A1 12/2020 Wintermantel

FOREIGN PATENT DOCUMENTS

| DE | 102015112861 A1 | 2/2016 |
| DE | 102014105845 B4 | 6/2019 |
| EP | 3579332 A1 | 12/2019 |
| WO | 2019166064 A1 | 9/2019 |

* cited by examiner

RADIO-FREQUENCY DEVICES AND ASSOCIATED PRODUCTION METHODS

CROSS REFERENCE TO RELATED APPLICATION

This application claims priority to German Patent Application No. 102020121855.9 filed on Aug. 20, 2020, the content of which is incorporated by reference herein in its entirety.

TECHNICAL FIELD

The present disclosure generally relates to radio-frequency (RF) technology. In particular, the present disclosure relates to RF devices and associated production methods.

BACKGROUND

RF devices can be used in automotive safety applications, for example. By way of example, radar sensors can be used for blind spot detection, automated speed regulation, collision avoidance systems, etc.

SUMMARY

Various aspects relate to a radio-frequency device. The radio-frequency device comprises a printed circuit board and a radio-frequency package, which is mounted on the printed circuit board at a first mounting point and has a radio-frequency chip and a radio-frequency radiation element, wherein the printed circuit board has a first elasticity at least in a first section comprising the first mounting point. The radio-frequency device further comprises a waveguide component, which is mounted on the printed circuit board at a second mounting point and has a waveguide, wherein the radio-frequency radiation element is configured to radiate signals into the waveguide and/or to receive signals by way of the waveguide. The printed circuit board has a second elasticity at least in a second section with an increased elasticity between the first mounting point and the second mounting point, wherein the second elasticity is higher than the first elasticity.

Various aspects relate to a radio-frequency device. The radio-frequency device comprises a printed circuit board and a radio-frequency package, which is mounted on the printed circuit board and has a radio-frequency chip and a radio-frequency radiation element. The radio-frequency device further comprises a waveguide component, which is mounted on the printed circuit board and has a waveguide, wherein the radio-frequency radiation element is configured to radiate signals into the waveguide and/or to receive signals by way of the waveguide. The radio-frequency device further comprises a compensation element, in order to absorb mechanical stresses that occur between the waveguide component and the printed circuit board by way of deformation of the compensation element.

Various aspects relate to a radio-frequency device. The radio-frequency device comprises a printed circuit board and a daughterboard arranged above the printed circuit board, wherein the daughterboard and the printed circuit board are electrically connected to one another via an electrical connection. The radio-frequency device further comprises a radio-frequency package having a radio-frequency chip and a radio-frequency radiation element, wherein the radio-frequency package is mechanically connected to the daughterboard. The radio-frequency device further comprises a waveguide component, which is arranged above the daughterboard and has a waveguide, wherein the radio-frequency radiation element is configured to radiate signals into the waveguide and/or to receive signals by way of the waveguide. The waveguide component and the daughterboard are arranged at a distance from the printed circuit board.

Various aspects relate to a method for producing a radio-frequency device. The method comprises mounting a radio-frequency package having a radio-frequency chip and a radio-frequency radiation element on a printed circuit board. The method further comprises mounting a waveguide component having a waveguide on the printed circuit board in such a way that a compensation element is formed, in order to absorb mechanical stresses that occur between the waveguide component and the printed circuit board by way of deformation of the compensation element. The radio-frequency radiation element is configured to radiate signals into the waveguide and/or to receive signals by way of the waveguide.

BRIEF DESCRIPTION OF THE DRAWINGS

Devices and methods in accordance with the disclosure are explained in greater detail below with reference to drawings. The elements shown in the drawings are not necessarily reproduced true to scale relative to one another. Identical reference signs can refer to identical components.

DETAILED DESCRIPTION

In the following detailed description, reference is made to the accompanying drawings, which show for illustration purposes specific aspects and implementations in which the disclosure can be implemented in practice. In this context, direction terms such as, for example, "at the top", "at the bottom", "at the front", "at the back", etc. can be used with respect to the orientation of the figures described. Since the components of the implementations described can be positioned in different orientations, the direction terms can be used for illustration purposes and are not restrictive in any way whatsoever. Other aspects can be used and structural or logical changes can be made, without departing from the concept of the present disclosure. In other words, the following detailed description should not be understood in a restrictive sense.

RF devices can be used in automotive safety applications, for example. By way of example, radar sensors can be used for blind spot detection, automated speed regulation, collision avoidance systems, etc. In one known approach, the RF signals provided by an RF device can be emitted by antennas arranged on a printed circuit board. For this purpose, the printed circuit board generally has to have an expensive RF laminate for the RF signal paths. Furthermore, in this approach, transport losses can occur during signal transfer between the RF chip and the RF antennas. Some implementations described herein may relate to improved RF devices and methods for producing such RF devices. The RF devices may comprise cost-effective RF devices having low power losses. Schematic views of RF devices in accordance with the disclosure are described below. In this case, the RF devices can be illustrated in a general way in order to describe aspects of the disclosure qualitatively. The RF devices can in each case have further aspects that are not illustrated in the figures for the sake of simplicity. For example, the respective RF devices can be extended by any aspects described in association with other devices or methods in accordance with the disclosure.

Figure 1:
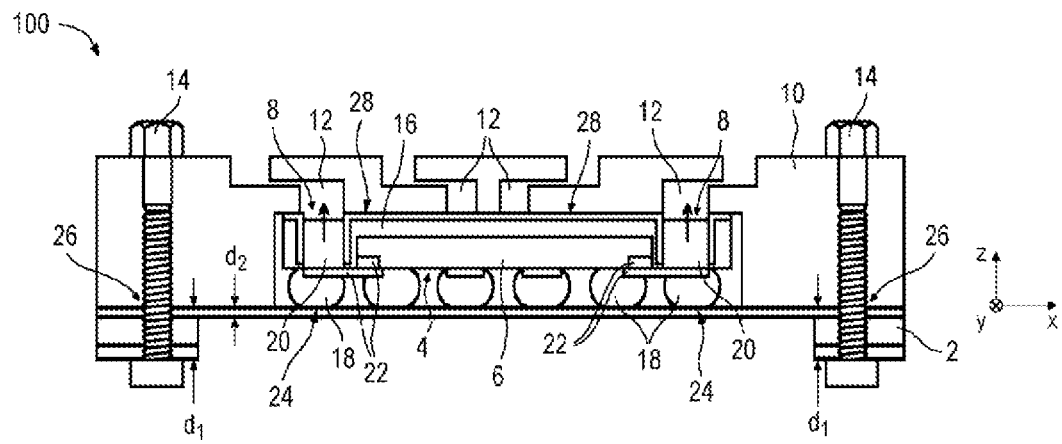
FIG. 1 schematically shows a cross-sectional side view of an RF device in accordance with the disclosure.

The RF device 100 of FIG. 1 can have a printed circuit board 2 and an RF package 4 arranged thereon. The RF package 4 can have an RF chip 6 and one or more RF radiation elements 8. The RF package 4 can also have a housing, which is formed by an encapsulation material 16 and in which the RF chip 6 and the RF radiation elements 8 can be at least partly embedded. The RF package 4 can be mechanically and electrically connected to the printed circuit board 2 by way of one or more connecting elements 18. A waveguide component 10 having one or more waveguides 12 can also be arranged on the printed circuit board 2. The waveguide component 10 can be secured to the printed circuit board 2 by way of one or more securing elements 14.

In some implementations, the RF chip 6 can comprise or correspond to a monolithic microwave integrated circuit (MMIC). The RF chip 6 can operate in various frequency ranges. Accordingly, the RF radiation elements 8 that are electrically coupled to the RF chip 6 can be configured to emit and/or to receive signals having frequencies in the frequency ranges. In one example, the RF chip 6 can operate in a radio-frequency or microwave frequency range that can generally range from approximately 10 GHz to approximately 300 GHz. By way of example, accordingly, circuits integrated into the RF chip 6 can operate in a frequency range of greater than approximately 10 GHz, and the RF radiation elements 8 can emit and/or receive signals having a frequency of greater than approximately 10 GHz. Microwave circuits of this type can comprise for example microwave transmitters, microwave receivers, microwave transceivers, microwave sensors or microwave detectors. The RF devices described herein can be used for example for radar applications in which the frequency of the RF signal can be modulated. Radar microwave devices can be used for example in automotive or industrial applications for distance determining/distance measuring systems. By way of example, automatic vehicle speed regulating systems or vehicle anticollision systems can operate in the microwave frequency range, for example in frequency bands of 76 GHz to 77 GHz and of 77 GHz to 81 GHz.

Alternatively or additionally, the RF chip 6 can operate in a Bluetooth frequency range. Such a frequency range can comprise for example an ISM (Industrial, Scientific and Medical) band between approximately 2.402 GHz and approximately 2.480 GHz. The RF chip 6 or circuits integrated into the RF chip 6 can accordingly more generally be configured to operate in a frequency range of greater than approximately 1 GHz, and the RF radiation elements 8 can accordingly be configured to emit and/or to receive signals having a frequency of greater than approximately 1 GHz.

It should be noted that the RF devices described herein do not have to be limited to the example technical fields that have already been mentioned. In further examples, the concepts proposed herein can also be implemented for the following other RF applications: Technologies at frequencies over 100 GHz, for example THz technologies; communication systems with high data transfer (for example 5G and/or the like) and wireless backhaul systems; body scanner systems (for example for security applications); medical systems and health monitoring systems (medical sensors and data transfer); radar systems; GBit automotive Ethernet; camera interfaces; gaming sensors; Industry 4.0; foodstuffs monitoring; radio astronomy and terrestrial observation; and/or the like.

In some implementations, as shown in FIG. 1, the RF chip 6 can be housed by the encapsulation material 16, that is to say the RF device 4 may be a semiconductor package or an RF package. The RF chip 6 and other components embedded therein can be protected from external influences, such as moisture for example, by way of the encapsulation material 16. The encapsulation material 16 can comprise for example at least one from a mold compound, a laminate, an epoxy, a filled epoxy, a glass-fiber-filled epoxy, an imide, a thermoplastic, a thermosetting polymer, or a polymer mixture. The RF packages described herein are not limited to a specific housing type. In some implementations, the RF chip 6 may comprise a bare die, that is to say a semiconductor chip without a housing. In some implementations, the RF package 4 can be for example a wafer level package, which can be produced in accordance with an eWLB (embedded Wafer Level Ball Grid Array) method, for example. Here, owing to the production process, the bottom side of the RF chip 6 and the bottom side of the encapsulation material 16 can lie in a common plane (e.g., the bottom side of the RF chip 6 and the bottom side of the encapsulation material 16 can be arranged in a co-planar manner).

The waveguide component 10 can be mechanically connected (e.g., directly) to the printed circuit board 2 by way of the securing elements 14. In some implementations, the waveguide component 10 can extend over the top side and the side surfaces of the RF package 4 and at least partly cover or encapsulate same. In some implementations, the waveguide component 10 can be mechanically connected directly to the printed circuit board 2 for example using screws 14. Alternatively or additionally, in further examples, a mechanical connection can be provided by one or more of an adhesive, a solder material, a clip, a clamp, a bracket, and/or the like.

Each of the RF radiation elements 8 can be configured to feed or to radiate into the corresponding waveguide 12 located above them RF signals that are generated by the RF chip 6 and guided to the RF radiation element 8. Alternatively or additionally, the RF radiation element 8 can be configured to receive RF signals radiated into the corresponding waveguide 12 from outside the RF device 100, which signals can then be forwarded to the RF chip 6. In the described context, the RF radiation element 8 can also be referred to as a "Waveguide Feed". In some implementations, to provide radiation into the waveguides 12, while reducing losses, the top side of the RF package 4 can make mechanical contact with the bottom side of the waveguide component 10. A flush termination between the RF package 4 and the waveguide component 10 resulting therefrom can prevent or at least reduce crosstalk between adjacent RF radiation elements 8 or adjacent channels.

The RF radiation elements 8 can be embodied in different ways. In some implementations, as shown in FIG. 1, each of the RF radiation elements 8 can comprise a waveguide transition element 20 integrated into the encapsulation material 16 and an electrical interconnect 22. The respective waveguide transition element 20 can be configured to feed an RF signal generated by the RF chip 6 into the associated waveguide 12 located above them, and vice versa. The electrical interconnect 22 can be configured to electrically couple the waveguide transition element 20 to the RF chip 6.

The waveguide transition element 20 and the electrical interconnect 22 can be configured for example to convert a transverse electromagnetic mode (TEM mode) of a microwave transmission line forming the electrical interconnect 22 into a transverse electric mode (TE mode) of the waveguide 12. The waveguide 12 can be aligned with the waveguide transition element 20 in order to provide an effective coupling of a waveguide signal to the waveguide 12. In some implementations, the waveguide transition element 20 may operate as a transmitter. In these implementations, the waveguide transition element 20 may for example also be referred to as a launcher, for example a $TE_{01}$ launcher, when the waveguide transition element 20 is used to feed the $TE_{10}$ mode into the waveguide 12.

The waveguide transition element 20 can be partly or completely embedded into the encapsulation material 16. The waveguide transition element 20 can comprise at least one electrically conductive wall structure. In some implementations, such an electrically conductive wall structure can be an "open structure", which can comprise, for example, one or more metallized via holes (not illustrated). When the waveguide 12 is embodied as a hollow waveguide, the metallized via holes may be regarded as a continuation of the hollow waveguide into the encapsulation material 16.

The electrical interconnect 22 can also be partly or completely embedded into the encapsulation material 16. In one example, the electrical interconnect 22 can be embodied as or comprise a hollow waveguide integrated into the encapsulation material 16. In some implementations, the electrical interconnect 22 can be embodied as an electrical redistribution layer, which can be arranged at a lower surface of the encapsulation material 16.

The waveguide component 10 can be formed integrally or comprise a plurality of parts. The waveguide component 10 can be fabricated from plastic, a ceramic material and/or a dielectric material. In some implementations, the waveguides 12 can be formed as hollow waveguides having metallized inner walls. In some implementations, when the waveguides 12 are formed as hollow waveguides having metallized inner walls, the hollow waveguides can be filled with air or gas. In some implementations, the hollow waveguides may not contain any solid or liquid. In other words, one or more of the waveguides 12 can be "material-free" hollow waveguides. Hollow waveguides of this kind can be embodied for example as WR (waveguide rectangular) hollow waveguides, for example as WR10 or WR12 hollow waveguides. In some implementations, the waveguides of RF devices in accordance with the disclosure can alternatively or additionally be formed as dielectric waveguides or substrate integrated waveguides (SIW).

In some implementations, the waveguide component 10 can be formed in a single-layer or multi-layered injection-molded plastic assembly. A waveguide 12 of the waveguide component 10 can comprise a metallized hollow waveguide formed in the injection-molded plastic assembly. The waveguide component 10 can have a combination of hollow waveguide sections that are connected to one another and can run horizontally and/or vertically. An example implementation of a horizontal hollow waveguide in a multi-layered injection-molded plastic assembly is shown and described in FIG. 9.

The RF package 4 can be mounted on the printed circuit board 2 at one or more first mounting points 24. In an analogous manner, the waveguide component 10 can be mounted on the printed circuit board 2 at one or more second mounting points 26. The RF package 4 and the waveguide component 10 can also be secured to one another at one or more third mounting points 28. On account of these mechanical connections between the RF package 4 and the printed circuit board 2 at the first mounting point 24, between the waveguide component 10 and the printed circuit board 2 at the second mounting point 26 and between the waveguide component 10 and the RF package 4 at the third mounting point 28, mechanical stresses can arise during the production and/or the operation of the RF device 100. These mechanical stresses can lead for example to mechanical loading of the connecting elements 18 and in the worst case to these breaking. In order to prevent such mechanical stresses, the printed circuit board 2 can have one or more sections with an increased elasticity in comparison with other sections of the printed circuit board 2. As a result thereof, the printed circuit board 2 can yield and in the process can provide mechanical stress relief in the event of mechanical stress arising at the points with an increased elasticity. Damage to the RF device 100 can be prevented or at least reduced in this way.

In some implementations, the printed circuit board 2 can have first sections with a first thickness $d_1$ at the edge regions and a thinned second section with a second thickness $d_2$ in a central region. The first thickness $d_1$ can be greater than approximately 1 mm, for example. In some implementations, the first thickness $d_1$ can be in a range of approximately 1.1 mm to approximately 1.6 mm. The second thickness $d_2$ can for example be less than approximately 500 µm. In some implementations, second thickness $d_2$ can be less than approximately 400 µm. In some implementations, second thickness $d_2$ can be less than approximately 300 µm. In some implementations, a thickness of the thinned part can have approximately 50% or less of the thickness of the printed circuit board 2 in other regions of the printed circuit board 2. In some implementations, the thinned second section of the printed circuit board 2, or at least a part of the thinned section, can be arranged between the first mounting point 24 and the second mounting point 26, which may enable the thinned section of the printed circuit board 2 to provide a mechanical stress relief. In other words, the path or the region between the mounting points 24 and 26 can be relieved of mechanical stress by way of the increased elasticity of the printed circuit board 2. In some implementations, the RF package 4 can be arranged completely above the thinned section of the printed circuit board 2. This means that the RF package 4 can be arranged completely within the thinned section of the printed circuit board 2 when viewed in the z direction.

The thinned second section of the printed circuit board 2 can have an increased elasticity in comparison to the first sections with a greater thickness. In the event of mechanical stresses arising, the printed circuit board 2 can therefore yield at least in the z direction, as a result of which damage to the connecting elements 18 can be prevented. The term "elasticity" used herein can be specified as the capability of a body or a material to reverse, under its own force, a change in shape caused by external influences. In some implementations, an increased elasticity of a body can be provided through the selection of a body material with a comparatively low modulus of elasticity. In some implementations, the elasticity of a body can be increased by way of a suitably selected geometric shape of the body.

In some implementations, to provide the regions with an increased elasticity, the printed circuit board 2 can comprise at least one of a semi-flex PCB or a rigid-flex PCB. A semi-flex PCB can be produced, for example, by virtue of a part of a rigid FR4 printed circuit board being thinned to less than approximately 0.5 mm. In some implementations, a part of a rigid FR4 printed circuit board may be thinned to a range of approximately 0.1 mm to approximately 0.2 mm, as a result of which may enable the rigid FR4 printed circuit board to bend up to a specific point. A rigid-flex PCB can be embodied as a hybrid board, which consists of a combination of rigid and flexible printed circuit boards. These rigid-flex PCBs can be configured by way of the combination of flexible printed circuit boards with one or more rigid printed circuit boards.

The number and arrangement of components shown in FIG. 1 are provided as an example. The RF device 100 may include additional components, fewer components, different components, or differently arranged components than those shown in FIG. 1. In some implementations, the RF device 100 may include one or more components described elsewhere herein. For example, RF device 100 may include one or more components described in connection with RF device 200 described in connection with FIG. 2, RF device 300 described in connection with FIG. 3, RF device 400 described in connection with FIG. 4, RF device 500 described in connection with FIG. 5, RF device 600 described in connection with FIG. 6, and/or RF device 700 described in connection with FIG. 7.

Additionally, or alternatively, a set of components (e.g., one or more components) of RF device 100 may perform one or more functions described as being performed by another set of components of another RF device described herein. For example, a set of component of RF device 100 may perform one or more functions described as being performed by a set of components of RF device 200 described in connection with FIG. 2, RF device 300 described in connection with FIG. 3, RF device 400 described in connection with FIG. 4, RF device 500 described in connection with FIG. 5, RF device 600 described in connection with FIG. 6, and/or RF device 700 described in connection with FIG. 7.

Figure 2:
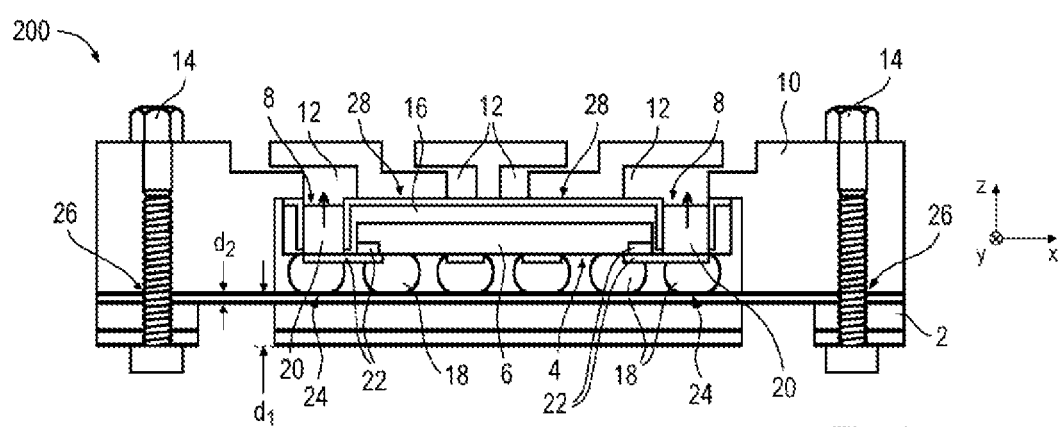
FIG. 2 schematically shows a cross-sectional side view of an RF device in accordance with the disclosure.

The RF device 200 of FIG. 2 may be similar to the RF device 100 of FIG. 1 at least in part. In some implementations, the thinned sections of the printed circuit board 2 with the thickness $d_2$ can be arranged at different positions with respect to the printed circuit board 2 of RF device 100. In some implementations, a thinned section of the printed circuit board 2 can be arranged on the left of the left-hand first mounting point 24, while a further thinned section of the printed circuit board 2 can be placed on the right of the right-hand first mounting point 24. As seen in the z direction, the thinned section of the printed circuit board 2 can be arranged outside of the RF package 4, that is to say the RF package 4 can be mounted completely on the thicker section of the printed circuit board 2 with the thickness $d_1$. Furthermore, when seen in the z direction, the thinned section can enclose or surround the RF package 4. In other words, the thinned sections illustrated as separate from one another in the side view of FIG. 2 can be connected to one another in a plan view. In analogy to FIG. 1, the thinned section of the printed circuit board 2 or at least a part of the thinned section can be arranged in particular between the first mounting point 24 and the second mounting point 26.

The number and arrangement of components shown in FIG. 2 are provided as an example. The RF device 200 may include additional components, fewer components, different components, or differently arranged components than those shown in FIG. 2. In some implementations, the RF device 200 may include one or more components described elsewhere herein. For example, RF device 200 may include one or more components described in connection with RF device 100 described in connection with FIG. 1, RF device 300 described in connection with FIG. 3, RF device 400 described in connection with FIG. 4, RF device 500 described in connection with FIG. 5, RF device 600 described in connection with FIG. 6, and/or RF device 700 described in connection with FIG. 7.

Additionally, or alternatively, a set of components (e.g., one or more components) of RF device 200 may perform one or more functions described as being performed by another set of components of another RF device described herein. For example, a set of component of RF device 200 may perform one or more functions described as being performed by a set of components of RF device 100 described in connection with FIG. 1, RF device 300 described in connection with FIG. 3, RF device 400 described in connection with FIG. 4, RF device 500 described in connection with FIG. 5, RF device 600 described in connection with FIG. 6, and/or RF device 700 described in connection with FIG. 7.

Figure 3:
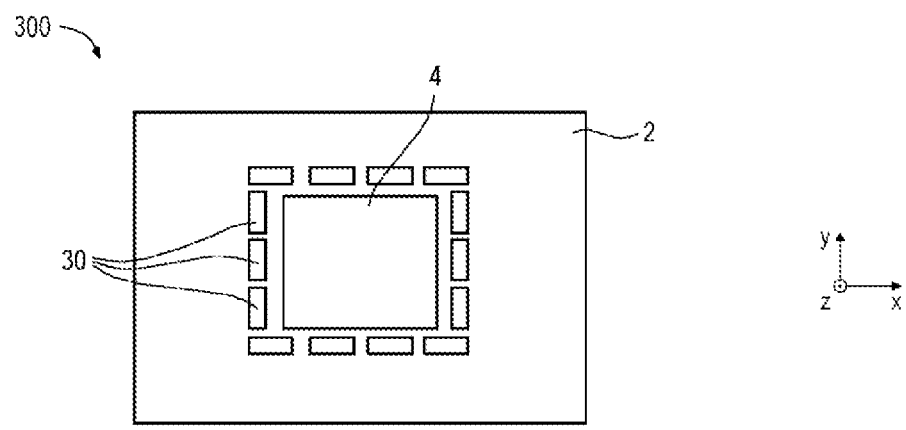
FIG. 3 schematically shows a plan view of an RF device in accordance with the disclosure.

The RF device 300 of FIG. 3 may be similar to the RF devices of the preceding examples at least in part. In the plan view of FIG. 3, some components of the RF device 300 are not shown for the sake of simplicity, for example a waveguide component of the RF device 300. In some implementations, sections of the printed circuit board 2 with an increased elasticity can be provided by one or more perforations (or openings or holes) 30 running through the printed circuit board 2. The perforations 30 can in this case run, in particular completely, from the top side of the printed circuit board 2 to the bottom side of the printed circuit board 2. In some implementations, the perforations 30 can have a rectangular shape, for example. In some implementations, the perforations 30 can have any desired other geometric shape, for example round, circular, elliptical, square, polygonal, etc. In some implementations, the perforations 30 can surround the RF package 4. For example, the perforations 30 can completely surround the RF package 4 or partially surround the RF package 4.

The number and arrangement of components shown in FIG. 3 are provided as an example. The RF device 300 may include additional components, fewer components, different components, or differently arranged components than those shown in FIG. 3. In some implementations, the RF device 300 may include one or more components described elsewhere herein. For example, RF device 300 may include one or more components described in connection with RF device 100 described in connection with FIG. 1, RF device 200 described in connection with FIG. 2, RF device 400 described in connection with FIG. 4, RF device 500 described in connection with FIG. 5, RF device 600 described in connection with FIG. 6, and/or RF device 700 described in connection with FIG. 7.

Additionally, or alternatively, a set of components (e.g., one or more components) of RF device 300 may perform one or more functions described as being performed by another set of components of another RF device described herein. For example, a set of component of RF device 300 may perform one or more functions described as being performed by a set of components of RF device 100 described in connection with FIG. 1, RF device 200 described in connection with FIG. 2, RF device 400 described in connection with FIG. 4, RF device 500 described in connection with FIG. 5, RF device 600 described in connection with FIG. 6, and/or RF device 700 described in connection with FIG. 7.

Figure 4:
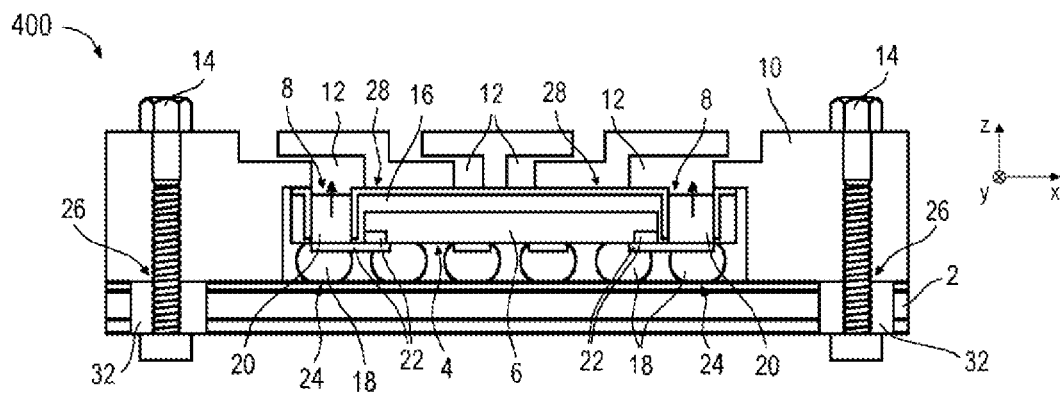
FIG. 4 schematically shows a cross-sectional side view of an RF device in accordance with the disclosure.

The RF device 400 of FIG. 4 may be similar to the RF devices of the preceding examples at least in part. In some implementations, the sections of the printed circuit board 2 with an increased elasticity can comprise one or more elastic inserts 32 in the printed circuit board 2. In some implementations, each of the elastic inserts 32 can be arranged at one of the second mounting points 26. In some implementations, the respective elastic insert 32 can extend from a bottom side of the printed circuit board 2 to a top side of the printed circuit board 2. In some implementations, an elastic insert 32 can extend only partly from the bottom side of the printed circuit board 2 into same. The securing element 14 arranged at the second mounting point 26 can run through the respective elastic insert 32.

The elastic insert 32 can have a modulus of elasticity with a value of less than approximately 5 GPa at approximately 25° C. In some implementations, the elastic insert 32 can have a modulus of elasticity with a value of less than approximately 3 GPa at approximately 25° C. In some implementations, the elastic insert 32 can have a modulus of elasticity with a value of less than approximately 2 GPa at approximately 25° C. In some implementations, the elastic insert 32 can have a modulus of elasticity with a value of less than approximately 1 GPa at approximately 25° C. In some implementations, the elastic insert 32 can have a modulus of elasticity with a value of less than approximately 0.5 GPa at approximately 25° C. In some implementations, the elastic insert 32 can be fabricated from a polymer, the modulus of elasticity of which may be in a range of approximately 0.5 to approximately 5 at approximately 25° C. The polymer can comprise for example one or more of PC (polycarbonate), PTFE (polytetrafluoroethylene) or PET (polyethylene terephthalate). In some implementations, the elastic insert 32 can be fabricated from a rubber, the modulus of elasticity of which can be in a range from approximately 0.01 to approximately 0.1 at approximately 25° C. In some implementations, the elastic insert can be fabricated from a silicone. In comparison to the elastic insert 32, a material of the printed circuit board 2 (for example FR4) can have a modulus of elasticity greater than approximately 20 at approximately 25° C.

As already described in connection with FIG. 1, mechanical stresses can result during the operation or the production of the RF device 400 on account of the mechanical fixing at the mounting points 24, 26 and 28. The elastic insert 32 can be deformable in all directions and in particular in the z direction. In the case of mechanical stresses arising, the elastic insert 32 can yield, as a result of which damage to the RF device 400 can be prevented. The elastic insert 32 can therefore have the function of a compensation element, which can be configured to absorb mechanical stresses that occur between the waveguide component 10 and the printed circuit board 2 by way of deformation of the compensation element 32.

The number and arrangement of components shown in FIG. 4 are provided as an example. The RF device 400 may include additional components, fewer components, different components, or differently arranged components than those shown in FIG. 4. In some implementations, the RF device 400 may include one or more components described elsewhere herein. For example, RF device 400 may include one or more components described in connection with RF device 100 described in connection with FIG. 1, RF device 200 described in connection with FIG. 2, RF device 300 described in connection with FIG. 3, RF device 500 described in connection with FIG. 5, RF device 600 described in connection with FIG. 6, and/or RF device 700 described in connection with FIG. 7.

Additionally, or alternatively, a set of components (e.g., one or more components) of RF device 400 may perform one or more functions described as being performed by another set of components of another RF device described herein. For example, a set of component of RF device 400 may perform one or more functions described as being performed by a set of components of RF device 100 described in connection with FIG. 1, RF device 200 described in connection with FIG. 2, RF device 300 described in connection with FIG. 3, RF device 500 described in connection with FIG. 5, RF device 600 described in connection with FIG. 6, and/or RF device 700 described in connection with FIG. 7.

Figure 5:
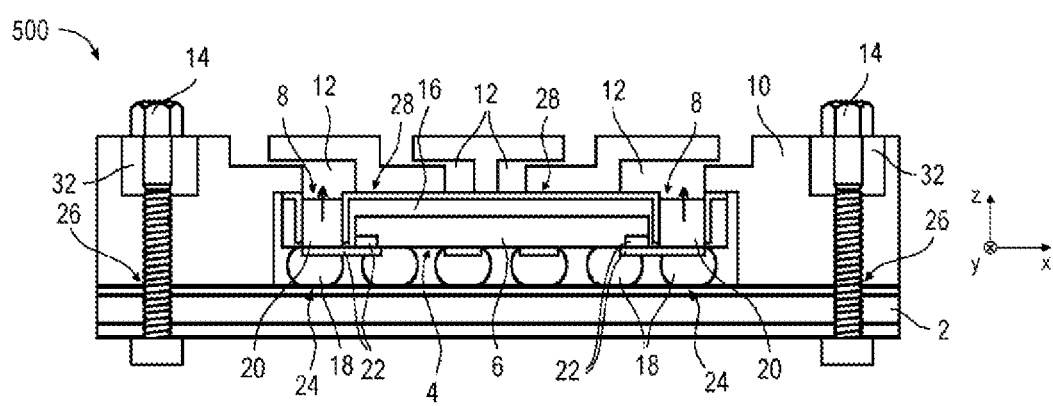
FIG. 5 schematically shows a cross-sectional side view of an RF device in accordance with the disclosure.

The RF device 500 of FIG. 5 may be similar to the RF device 400 of FIG. 4 at least in part. In some implementations, one or more elastic inserts or compensation elements 32 can be arranged in the waveguide component 10. In some implementations, the elastic inserts 32 are placed for example on a surface of the waveguide component 10 that faces away from the printed circuit board 2. One or more of the securing elements 14 can in this case run through the elastic inserts 32. In analogy to FIG. 4, mechanical stresses arising between the waveguide component 10 and the printed circuit board 2 can be absorbed by way of deformation of the elastic inserts 32. In the examples of FIGS. 4 and 5, the elastic inserts 32 are arranged either in the printed circuit board 2 or in the waveguide component 10. In some implementations, the elastic inserts 32 can be arranged both in the printed circuit board 2 and in the waveguide component 10.

The number and arrangement of components shown in FIG. 5 are provided as an example. The RF device 500 may include additional components, fewer components, different components, or differently arranged components than those shown in FIG. 5. In some implementations, the RF device 500 may include one or more components described elsewhere herein. For example, RF device 500 may include one or more components described in connection with RF device 100 described in connection with FIG. 1, RF device 200 described in connection with FIG. 2, RF device 300 described in connection with FIG. 3, RF device 400 described in connection with FIG. 4, RF device 600 described in connection with FIG. 6, and/or RF device 700 described in connection with FIG. 7.

Additionally, or alternatively, a set of components (e.g., one or more components) of RF device 500 may perform one or more functions described as being performed by another set of components of another RF device described herein. For example, a set of component of RF device 500 may perform one or more functions described as being performed by a set of components of RF device 100 described in connection with FIG. 1, RF device 200 described in connection with FIG. 2, RF device 300 described in connection with FIG. 3, RF device 400 described in connection with FIG. 4, RF device 600 described in connection with FIG. 6, and/or RF device 700 described in connection with FIG. 7.

Figure 6:
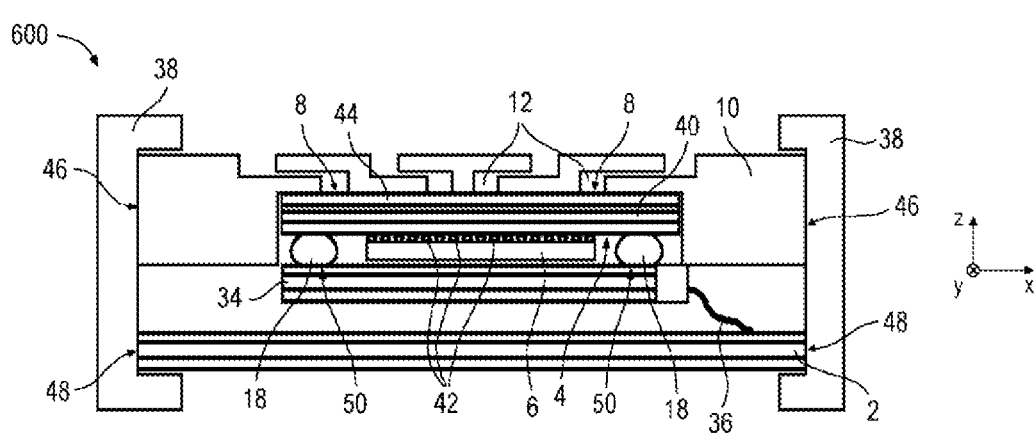
FIG. 6 schematically shows a cross-sectional side view of an RF device in accordance with the disclosure.

The RF device 600 of FIG. 6 can have a printed circuit board 2 and a daughterboard 34 arranged above the printed circuit board 2. The printed circuit board 2 and the daughterboard 34 can be electrically connected to one another by way of an electrical connection 36. In some implementations, the electrical connection 36 can comprise for example at least one of a cable or a flexboard connection. An RF package 4 having an RF chip 6 and one or more RF radiation elements 8 can be mechanically connected to the daughterboard 34. A waveguide component 10 having one or more waveguides 12 can be arranged above the daughterboard 34. The RF radiation elements 8 can be configured to radiate signals into the respective waveguide 12 located above them and/or to receive signals by way of the respective waveguide 12. The waveguide component 10 and the daughterboard 34 can be arranged at a distance from the printed circuit board 2. One or more of the mentioned components of the RF device 600 can be arranged in a housing 38.

In comparison to the implementations described above, the RF package 4 may be a different housing type. The RF package 4 can have a substrate 40, on the bottom side of which the RF chip 6 and connecting elements 18 can be arranged, using which the RF package 4 can be mechanically and electrically connected to the daughterboard 34. The substrate 40 may be in particular a ball grid array (BGA) substrate. Furthermore, the RF chip 6 can be electrically and mechanically connected to the substrate 40 via terminal elements 42 in particular using flip chip technology. The substrate 40 and the RF chip 6 can therefore form in particular a flip chip ball grid array (FCBGA).

The substrate 40 can have one or more layers composed of a ceramic or dielectric material. Structures for guiding and redistributing electrical signals can be embedded in these layers. In FIG. 6, exact profiles of these signal guiding structures are not shown for the sake of simplicity. The signal guiding structures can be configured inter alia to electrically couple the RF chip 6 and the connecting elements 18. The daughterboard 34 can also have signal guiding structures, which may be similar to those of the substrate 40. The RF chip 6 can therefore be electrically connected to the printed circuit board 2 by way of the terminal elements 42, the substrate 40, the connecting elements 18, the daughterboard 34 and the electrical connection 36, and vice versa.

The RF radiation elements 8, which can have the functionalities already described in connection with FIG. 1, can be arranged on the top side of the substrate 40. In some implementations, an RF radiation element 8 of FIG. 6 can be configured for example as an RF antenna within a structured metal layer 44 on the top side of the substrate 40. In this case, such an antenna cannot necessarily emit into space uniformly but can be configured to feed in a suitable manner the electromagnetic waves generated by it into the corresponding waveguide 12 aligned with the antenna.

The printed circuit board 2 can be mounted on an inner side of the housing 38 at one or more mounting points 48. In an analogous manner, the waveguide component 10 can be mounted on an inner side of the housing 38 at one or more mounting points 46. These instances of the printed circuit board 2 and the waveguide component 10 being secured can be carried out for example by way of an adhesive or a solder material. Furthermore, the RF package 4 can be secured to the daughterboard 34 at one or more mounting points 50. The waveguide component 10 and the daughterboard 34 can be arranged at a distance from the printed circuit board 2. As a result thereof, the mounting point 48 can be mechanically decoupled from the other mounting points 46 and 50. In analogy to the preceding examples, mechanical stresses arising during the operation or the production of the RF device 600 can be prevented by way of such mechanical decoupling.

The number and arrangement of components shown in FIG. 6 are provided as an example. The RF device 600 may include additional components, fewer components, different components, or differently arranged components than those shown in FIG. 6. In some implementations, the RF device 600 may include one or more components described elsewhere herein. For example, RF device 600 may include one or more components described in connection with RF device 100 described in connection with FIG. 1, RF device 200 described in connection with FIG. 2, RF device 300 described in connection with FIG. 3, RF device 400 described in connection with FIG. 4, RF device 500 described in connection with FIG. 5, and/or RF device 700 described in connection with FIG. 7.

Additionally, or alternatively, a set of components (e.g., one or more components) of RF device 600 may perform one or more functions described as being performed by another set of components of another RF device described herein. For example, a set of component of RF device 600 may perform one or more functions described as being performed by a set of components of RF device 100 described in connection with FIG. 1, RF device 200 described in connection with FIG. 2, RF device 300 described in connection with FIG. 3, RF device 400 described in connection with FIG. 4, RF device 500 described in connection with FIG. 5, and/or RF device 700 described in connection with FIG. 7.

Figure 7:
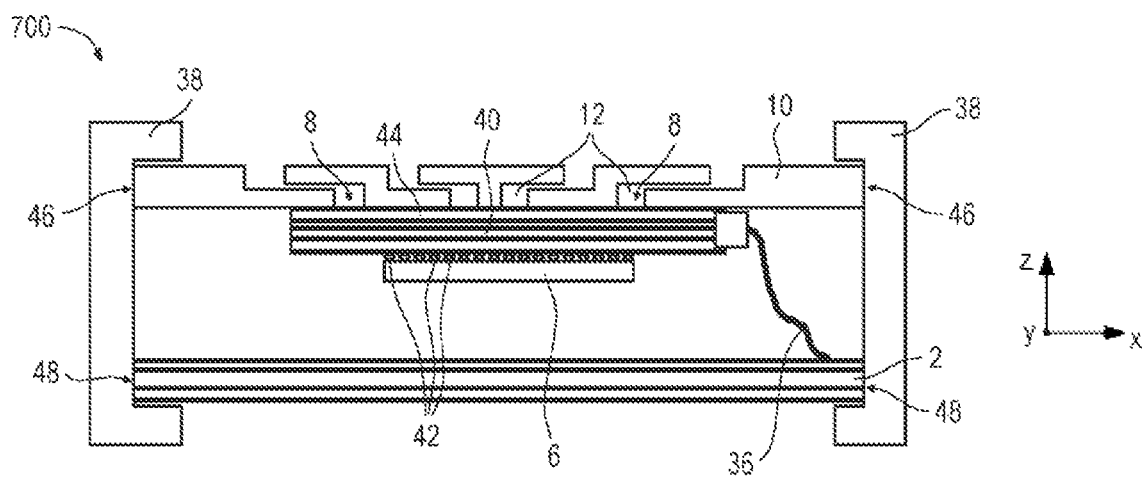
FIG. 7 schematically shows a cross-sectional side view of an RF device in accordance with the disclosure.

The RF device 700 of FIG. 7 may be similar to the RF device 600 of FIG. 6 at least in part. In some implementations, the RF chip 6 or an RF package having the RF chip 6 can be arranged directly on the bottom side of a daughterboard. In some implementations, the daughterboard can be embodied in the form of a laminate 40 with a structured metal layer 44 and RF antennas 8. The RF chip 6 and the waveguide component 10 can therefore be arranged above opposite surfaces of the daughterboard. In some implementations, the waveguide component 10 can extend only over the top side of the laminate 40, wherein side surfaces of the laminate 40 can be uncovered by the waveguide component 10.

The number and arrangement of components shown in FIG. 7 are provided as an example. The RF device 700 may include additional components, fewer components, different components, or differently arranged components than those shown in FIG. 7. In some implementations, the RF device 700 may include one or more components described elsewhere herein. For example, RF device 700 may include one or more components described in connection with RF device 100 described in connection with FIG. 1, RF device 200 described in connection with FIG. 2, RF device 300 described in connection with FIG. 3, RF device 400 described in connection with FIG. 4, RF device 500 described in connection with FIG. 5, and/or RF device 600 described in connection with FIG. 6.

Additionally, or alternatively, a set of components (e.g., one or more components) of RF device 700 may perform one or more functions described as being performed by another set of components of another RF device described herein. For example, a set of component of RF device 700 may perform one or more functions described as being performed by a set of components of RF device 100 described in connection with FIG. 1, RF device 200 described in connection with FIG. 2, RF device 300 described in connection with FIG. 3, RF device 400 described in connection with FIG. 4, RF device 500 described in connection with FIG. 5, and/or RF device 600 described in connection with FIG. 6.

Figure 8:
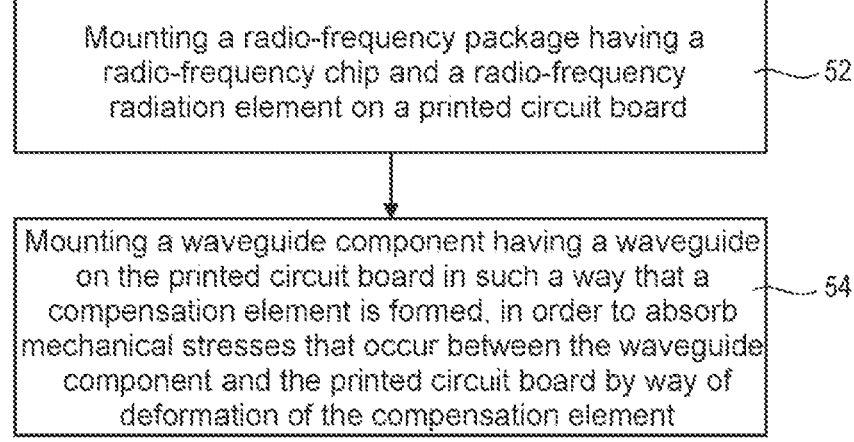
FIG. 8 shows a flow diagram of a method for producing an RF device in accordance with the disclosure.

FIG. 8 shows a flow diagram of a method for producing an RF device in accordance with the disclosure. By way of example, one of the RF devices described herein can be produced by the method. The method is illustrated in a general way in order to describe aspects of the disclosure qualitatively. The method can be extended by one or more aspects described in association with above-described examples in accordance with the disclosure.

In 52, a radio-frequency package having a radio-frequency chip and a radio-frequency radiation element can be mounted on a printed circuit board. In 54, a waveguide component having a waveguide can be mounted on the printed circuit board in such a way that a compensation element is formed, in order to absorb mechanical stresses that occur between the waveguide component and the printed circuit board by way of deformation of the compensation element. The radio-frequency radiation element can be configured to radiate signals into the waveguide and/or to receive signals by way of the waveguide. The method of FIG. 8 can have one or more further method procedures. For example, the radio-frequency package can be mounted on the waveguide component before the waveguide component is mounted on the printed circuit board.

Figure 9:
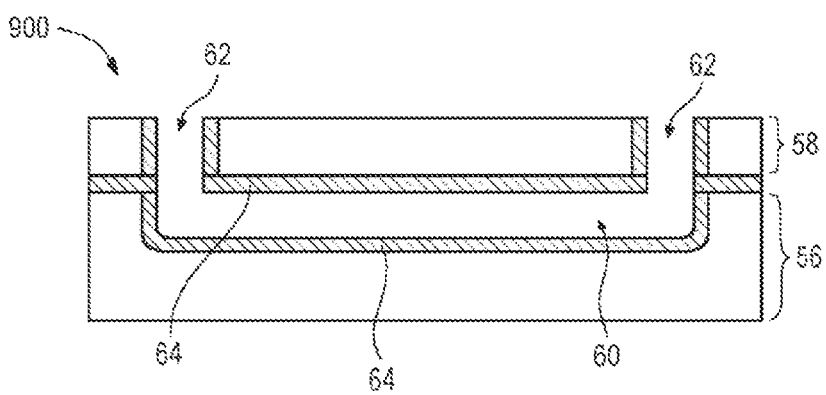
FIG. 9 schematically shows a cross-sectional side view of a multi-layered injection-molded plastic assembly with an integrated hollow waveguide.

FIG. 9 schematically shows a cross-sectional side view of a multilayered injection-molded plastic assembly 900 with an integrated hollow waveguide. By way of example, the waveguide component 10 of FIG. 1 can be embodied by a similar injection-molded plastic assembly. The injection-molded plastic assembly 900 can comprise a first layer arrangement 56 and a second layer arrangement 58. Each of the layer arrangements 56 and 58 can comprise one or more layers, for example layers composed of a ceramic and/or dielectric material. The first layer arrangement 56 can have a cut-out 60 running horizontally, while the second layer arrangement 58 can have through holes 62 running vertically through the second layer arrangement 58. The layer arrangements 56 and 58 can be aligned with one another such that the cut-out 60 and the through holes 62 form a channel running continuously through the layer arrangements 56 and 58. The inner walls of the channel can be covered by a metallization 64 throughout. The channel with its metallized inner walls can thus form a hollow waveguide through the layer arrangements 56 and 58.

FIG. 9 illustrates by way of example a substantially horizontal course of a hollow waveguide through a multi-layered injection-molded plastic assembly 900. Only part of the injection-molded plastic assembly 900 is illustrated here. The injection-molded plastic assembly 900 can have any desired number of further layer arrangements that can be structured and arranged one above another in such a way that one or more hollow waveguides with any desired combination of, in particular, horizontal and/or vertical sections can extend through the injection-molded plastic assembly 900. Any desired course of the hollow waveguide(s) through the injection-molded plastic assembly 900 can be realized by a suitable combination of horizontal and/or vertical sections.

ASPECTS

Devices and production methods are explained below based on aspects.

Aspect 1 is a radio-frequency device, comprising: a printed circuit board; a radio-frequency package, which is mounted on the printed circuit board at a first mounting point and has a radio-frequency chip and a radio-frequency radiation element, wherein the printed circuit board has a first elasticity at least in a first section comprising the first mounting point; and a waveguide component, which is mounted on the printed circuit board at a second mounting point and has a waveguide, wherein the radio-frequency radiation element is configured to radiate signals into the waveguide and/or to receive signals by way of the waveguide, wherein the printed circuit board has a second elasticity at least in a second section with an increased elasticity between the first mounting point and the second mounting point, wherein the second elasticity is higher than the first elasticity.

Aspect 2 is a radio-frequency device according to aspect 1, wherein the section with an increased elasticity comprises a thinned section of the printed circuit board.

Aspect 3 is a radio-frequency device according to aspect 2, wherein a thickness of the thinned section of the printed circuit board is less than 500 micrometers.

Aspect 4 is a radio-frequency device according to aspects 2 or 3, wherein the entire radio-frequency package is arranged within the thinned section of the printed circuit board in a plan view of the printed circuit board.

Aspect 5 is a radio-frequency device according to one of aspects 2 to 4, wherein the thinned section of the printed circuit board is arranged outside of the radio-frequency package in a plan view of the printed circuit board.

Aspect 6 is a radio-frequency device according to one of the preceding aspects, wherein the printed circuit board comprises at least one of a semi-flex PCB or a rigid-flex PCB.

Aspect 7 is a radio-frequency device according to one of the preceding aspects, wherein the section with an increased elasticity comprises a perforation that runs through the printed circuit board.

Aspect 8 is a radio-frequency device according to one of the preceding aspects, wherein the section with an increased elasticity comprises an elastic insert in the printed circuit board.

Aspect 9 is a radio-frequency device according to aspect 8, wherein the elastic insert is arranged at the second mounting point.

Aspect 10 is a radio-frequency device according to aspects 8 or 9, wherein the waveguide component at the second mounting point is mounted on the printed circuit board by way of a securing element and the securing element runs through the elastic insert.

Aspect 11 is a radio-frequency device according to aspect 10, further comprising a further elastic insert in the waveguide component on a surface of the waveguide component that faces away from the printed circuit board, wherein the securing element runs through the further elastic insert.

Aspect 12 is a radio-frequency device according to one of aspects 8 to 11, wherein a modulus of elasticity of the elastic insert has a value of less than 5 GPa at 25° C.

Aspect 13 is a radio-frequency device according to one of aspects 8 to 12, wherein the elastic insert is fabricated from at least one of a rubber, a silicone or a polymer.

Aspect 14 is a radio-frequency device according to one of the preceding aspects, wherein a top side of the radio-frequency package makes mechanical contact with a bottom side of the waveguide component.

Aspect 15 is a radio-frequency device according to one of the preceding aspects, wherein the section with an increased elasticity surrounds the radio-frequency package in a plan view of the printed circuit board.

Aspect 16 is a radio-frequency device according to one of the preceding aspects, wherein the waveguide component is formed in a multi-layered injection-molded plastic assembly and the waveguide comprises a metallized hollow waveguide formed in the injection-molded plastic assembly.

Aspect 17 is a radio-frequency device, comprising: a printed circuit board; a radio-frequency package, which is mounted on the printed circuit board and has a radio-frequency chip and a radio-frequency radiation element; a waveguide component, which is mounted on the printed circuit board and has a waveguide, wherein the radio-frequency radiation element is configured to radiate signals into the waveguide and/or to receive signals by way of the waveguide; and a compensation element, in order to absorb mechanical stresses that occur between the waveguide component and the printed circuit board by way of deformation of the compensation element.

Aspect 18 is a radio-frequency device according to aspect 17, wherein the compensation element is arranged in the printed circuit board.

Aspect 19 is a radio-frequency device according to aspects 17 or 18, wherein the compensation element is arranged in the waveguide component.

Aspect 20 is a radio-frequency device, comprising: a printed circuit board; a daughterboard arranged above the printed circuit board, wherein the daughterboard and the printed circuit board are electrically connected to one another via an electrical connection; a radio-frequency package having a radio-frequency chip and a radio-frequency radiation element, wherein the radio-frequency package is mechanically connected to the daughterboard; and a waveguide component, which is arranged above the daughterboard and has a waveguide, wherein the radio-frequency radiation element is configured to radiate signals into the waveguide and/or to receive signals by way of the waveguide, wherein the waveguide component and the daughterboard are arranged at a distance from the printed circuit board.

Aspect 21 is a radio-frequency device according to aspect 20, wherein the radio-frequency package and the waveguide component are arranged above the same surface of the daughterboard.

Aspect 22 is a radio-frequency device according to aspect 20, wherein the radio-frequency package and the waveguide component are arranged above opposite surfaces of the daughterboard.

Aspect 23 is a radio-frequency device according to one of aspects 20 to 22, wherein the electrical connection between the printed circuit board and the daughterboard comprises at least one of a cable and a flexboard connection.

Aspect 24 is a radio-frequency device according to one of aspects 20 to 23, further comprising a housing, wherein the printed circuit board is mounted on an inner side of the housing.

Aspect 25 is a method for producing a radio-frequency device, wherein the method comprises: mounting a radio-frequency package having a radio-frequency chip and a radio-frequency radiation element on a printed circuit board; and mounting a waveguide component having a waveguide on the printed circuit board in such a way that a compensation element is formed, in order to absorb mechanical stresses that occur between the waveguide component and the printed circuit board by way of deformation of the compensation element, wherein the radio-frequency radiation element is configured to radiate signals into the waveguide and/or to receive signals by way of the waveguide.

Aspect 26 is a method according to aspect 25, further comprising: mounting the radio-frequency package on the waveguide component before the waveguide component is mounted on the printed circuit board.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Furthermore, the words "over" and "on" used for example with respect to a material layer that is formed "over" or "on" a surface of an object or is situated "over" or "on" the surface can be used in the present description in the sense that the material layer is arranged (for example formed, deposited, etc.) "directly on", for example in direct contact with, the surface meant. The words "over" and "on" used for example with respect to a material layer that is formed or arranged "over" or "on" a surface can also be used in the present text in the sense that the material layer is arranged (e.g. formed, deposited, etc.) "indirectly on" the surface meant, wherein for example one or more additional layers are situated between the surface meant and the material layer.

Insofar as the terms "have", "contain", "encompass", "with" or variants thereof are used either in the detailed description or in the claims, these terms are intended to be inclusive in a similar manner to the term "comprise". That means that within the meaning of the present description the terms "have", "contain", "encompass", "with", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "example" is used in the present text in the sense that it serves as an example, a case or an illustration. An aspect or a configuration that is described as "example" in the present text should not necessarily be understood in the sense as though it has advantages over other aspects or configurations. Rather, the use of the word "example" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A or B or the like generally means A or B or both A and B.

Devices and methods for producing devices are described in the present description. Observations made in connection with a device described can also apply to a corresponding method, and vice versa. If a specific component of a device is described, for example, then a corresponding method for producing the device can contain an action for providing the component in a suitable manner, even if such an action is not explicitly described or illustrated in the figures. Moreover, the features of the various example aspects described in the present text can be combined with one another, unless expressly noted otherwise.

Although the disclosure has been shown and described with respect to one or more implementations, equivalent alterations and modifications based at least in part on the reading and understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function of the example implementations of the disclosure as presented herein. Furthermore, even if a specific feature of the disclosure has been disclosed with respect to only one of various implementations, such a feature can be combined with one or more other features of the other implementations in a manner such as is desired and advantageous for a given or specific application.

What is claimed is:

1. A radio-frequency device, comprising:
   a printed circuit board;
   a radio-frequency package, which is mounted on a side of the printed circuit board at a first mounting point and has a radio-frequency chip and a radio-frequency radiation element, wherein the printed circuit board has a first elasticity at least in a first section comprising the first mounting point; and
   a waveguide component, which is mounted on the side of the printed circuit board and above the radio-frequency package at a second mounting point and has a waveguide, wherein the radio-frequency radiation element is configured to radiate signals into the waveguide and/or to receive signals by way of the waveguide,
   wherein the printed circuit board has a second elasticity at least in a second section with an increased elasticity between the first mounting point and the second mounting point, and wherein the second elasticity is higher than the first elasticity.

2. The radio-frequency device as claimed in claim 1, wherein the second section with the increased elasticity comprises a thinned section of the printed circuit board.

3. The radio-frequency device as claimed in claim 2, wherein a thickness of the thinned section of the printed circuit board is less than 500 micrometers.

4. The radio-frequency device as claimed in claim 2, wherein the entire radio-frequency package is arranged within the thinned section of the printed circuit board in a plan view of the printed circuit board.

5. The radio-frequency device as claimed in claim 2, wherein the thinned section of the printed circuit board is arranged outside of the radio-frequency package in a plan view of the printed circuit board.

6. The radio-frequency device as claimed in claim 1, wherein the printed circuit board comprises at least one of a semi-flex PCB or a rigid-flex PCB.

7. The radio-frequency device as claimed in claim 1, wherein the second section with the increased elasticity comprises a perforation that runs through the printed circuit board.

8. The radio-frequency device as claimed in claim 1, wherein the second section with the increased elasticity comprises an elastic insert in the printed circuit board.

9. The radio-frequency device as claimed in claim 8, wherein the elastic insert is arranged at the second mounting point.

10. The radio-frequency device as claimed in claim 8, wherein the waveguide component at the second mounting point is mounted on the printed circuit board by way of a securing element and wherein the securing element extends through the elastic insert.

11. The radio-frequency device as claimed in claim 10, further comprising a further elastic insert in the waveguide component on a surface of the waveguide component that faces away from the printed circuit board, wherein the securing element runs through the further elastic insert.

12. The radio-frequency device as claimed in claim 8, wherein a modulus of elasticity of the elastic insert has a value of less than 5 GPa at 25° C.

13. The radio-frequency device as claimed in claim 8, wherein the elastic insert is fabricated from at least one of a rubber, a silicone, or a polymer.

14. The radio-frequency device as claimed in claim 1, wherein a top side of the radio-frequency package makes mechanical contact with a bottom side of the waveguide component.

15. The radio-frequency device as claimed in claim 1, wherein the second section with the increased elasticity surrounds the radio-frequency package in a plan view of the printed circuit board.

16. The radio-frequency device as claimed in claim 1, wherein the waveguide component is formed in a multi-layered injection-molded plastic assembly, and wherein the waveguide comprises a metallized hollow waveguide formed in the injection-molded plastic assembly.

17. A radio-frequency device, comprising:
    a printed circuit board;
    a radio-frequency package, which is mounted on a side of the printed circuit board and has a radio-frequency chip and a radio-frequency radiation element;
    a waveguide component, which is mounted on the side of the printed circuit board and above the radio-frequency package and has a waveguide, wherein the radio-frequency radiation element is configured to one or more of: radiate signals into the waveguide or receive signals by way of the waveguide; and
    a compensation element configured to absorb mechanical stresses that occur between the waveguide component and the printed circuit board by way of deformation of the compensation element.

18. The radio-frequency device as claimed in claim 17, wherein the compensation element is arranged in the printed circuit board.

19. The radio-frequency device as claimed in claim 17, wherein the compensation element is arranged in the waveguide component.

20. A method for producing a radio-frequency device, wherein the method comprises:
    mounting a radio-frequency package having a radio-frequency chip and a radio-frequency radiation element on a side of a printed circuit board; and
    mounting a waveguide component having a waveguide on the side of the printed circuit board and above the radio-frequency package to form a compensation element, wherein the compensation element is configured to absorb mechanical stresses that occur between the waveguide component and the printed circuit board by way of deformation of the compensation element, and wherein the radio-frequency radiation element is configured to one or more of: radiate signals into the waveguide or receive signals by way of the waveguide.

21. The method as claimed in claim 20, further comprising:
mounting the radio-frequency package on the waveguide component before the waveguide component is mounted on the printed circuit board.

* * * * *